(12) United States Patent
Nakano

(10) Patent No.: US 6,515,549 B2
(45) Date of Patent: Feb. 4, 2003

(54) SEMICONDUCTOR DEVICE HAVING CRITICAL PATH CONNECTED BY FEEDBACK RING OSCILLATOR

(75) Inventor: Toshihiko Nakano, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/793,655

(22) Filed: Feb. 27, 2001

(65) Prior Publication Data

US 2001/0019291 A1 Sep. 6, 2001

(30) Foreign Application Priority Data

Mar. 1, 2000 (JP) ........................................ 2000-055204

(51) Int. Cl.[7] .............................. H03B 5/24; G01R 27/28
(52) U.S. Cl. ........................... 331/57; 331/44; 331/173; 331/DIG. 3; 324/612
(58) Field of Search ........................... 331/44, 57, 143, 331/153, 173, DIG. 3; 324/600, 612

(56) References Cited

U.S. PATENT DOCUMENTS 5,923,676 A * 7/1999 Sunter et al. ............... 371/22.5
6,223,314 B1 * 4/2001 Arabi et al. ................ 714/726

FOREIGN PATENT DOCUMENTS

| JP | 61149871 A | 7/1986 |
| JP | 09089980 A | 4/1997 |
| JP | 11166960 A | 6/1999 |

* cited by examiner

Primary Examiner—David C. Mis
(74) Attorney, Agent, or Firm—Young & Thompson

(57) ABSTRACT

In a semiconductor integrated circuit, a selector 1 selects a signal FB at the input thereof by giving a proper level to a signal EN. By setting two-phase scan clocks SC1, SC2 of F/F 2,4 so that F/F 2,4 are set to the through state, a signal can be passed from F/F 2 to F/F 4 under a through state in the above circuit. Further, there can be fabricated a critical path-ring oscillator which is self-oscillated in the critical path by negatively feeding back the output of F/F 4 to F/F 2 through the signal FB. The logic in the ring is required to be an inverted logic. In a test other than a speed screening test or at the normal operation time, a proper level is given to the signal EN so that the selector 1 is switched to select the input side, thereby cutting a negative feedback path through which the output of F/F 4 is negatively fed back to F/F2.

10 Claims, 4 Drawing Sheets

SEMICONDUCTOR DEVICE HAVING CRITICAL PATH CONNECTED BY FEEDBACK RING OSCILLATOR

BACKGROUND OF THE INVENTION

1. Field of the Invention

The present invention relates to a semiconductor integrated circuit and a semiconductor device and particularly, to LSI (Large Scale Integrated Circuit).

2. Description of the Related Art

Recently, the clock frequency of LSI has been acceleratingly increased, and now it is about to exceed 1 GHz. On the other hand, LSI testers for measuring LSIs have not been able to measure them any more when the LSIs operate at their normal clock frequencies. This is not only because the clock frequencies of LSIs exceed the measuring capability of the LSI testers, but also because reduction of the cost of the LSI test is required and thus LSI testers which are low in price and have low performance are often used.

In general, the measurement using an LSI tester is carried out by a screening test based on an operation check at a low frequency, and thus no AC speed screening test is not carried out. Here, the speed means the operable frequency of LSI. In the following description, The test of the operable frequency to screen LSI will be hereinafter referred to as "speed screening". There occurs such a case that the speed of a gate element or the like of LSI is greatly varied due to a slight manufacturing error in a manufacturing process of LSI. Accordingly, the speed screening has been increasingly needed for LSI which aims to achieve high specification performance.

The speed screening is separately carried out. A first method for the speed screening is to carry out the test under the same environment as the condition under which LSI is actually used. Accordingly, according to this method, LSI is measured while it is mounted on a print board or in a device such as a computer device.

A second method for the speed screening is to estimate the performance of the whole LSI from the performance of a correlated circuit without actually measuring the speed itself. This method performs the measurement at the LSI tester level.

In general, the frequency measurement of a ring oscillator in which NAND circuits 31 to 3$n$ (n=2 m+1 when m is a natural number) at odd-number stages are linked to one another in the form of a ring as shown in FIG. 1 is utilized for the estimation. Signal EN is input to input terminal of NAND circuit 31. Signal FB is negatively fed back from the output of NAND circuits 3$n$ to the input of NAND circuits 31. The speed of a gate element per stage can be measured by measuring the oscillation frequency of the ring oscillator, and the operating frequency of LSI is estimated from this value.

In the first method of the conventional LSI speed screening method described above, a cost is needed to fabricate LSI into a package because LSI must be actually mounted, and thus the fabrication cost needed for LSI which is detected as a defective by the speed screening is wasted.

Further, another cost is needed to prepare the estimation environment for the device and the print board, and also a using cost of a measuring device and labor costs are needed. These costs finally reflect and increase the prices of LSI and the device such as the computer device.

On the other hand, the disadvantage of the second method resides in that the frequency of the ring oscillator and the LSI performance cannot be fully correlated with each other. The LSI performance is substantially determined by the delay between specific circuits which are called as a critical path. When gate elements (such as inverter and NAND circuit) constituting the critical path is positionally dispersed in LSI, the gate elements are connected to one another through wires.

On the other hand, the ring oscillator is usually constructed under the state that there is substantially no wire because it suffers size restriction or the like. Therefore, in a micro-processing manufacturing process popularly called as 0.18 $\mu$m/0.15 $\mu$m rule, the wire delay is increased to a larger value which is not negligible as compared with the gate element delay.

Accordingly, it is estimated that the precision of the correlation between the gate element delay calculated from the frequency measurement of the ring oscillator and the delay of the critical path is not high. Further, it is difficult to design the ring oscillator so that the precision is high.

SUMMARY OF THE INVENTION

Therefore, an object of the present invention is to provide a semiconductor integrated circuit and a semiconductor device in which LSI performance can be examined at the LSI tester level.

A semiconductor integrated circuit according to the present invention contains a critical path representing a signal path and has a ring oscillator which is constructed so as to negatively feed back the output of the critical path to the input of the critical path.

A semiconductor device according to the present invention comprises first and second semiconductor integrated circuits; and first and second transmission paths connecting to each other between the first semiconductor and the second semiconductor, wherein at least one circuit element of the first semiconductor integrated circuit, the first transmission path and at least one circuit element of the second semiconductor integrated circuit construct a first critical path, at least one circuit element of the first semiconductor integrated circuit, the second transmission path and at least one circuit element of the second semiconductor integrated circuit construct a second critical path, and the first and second critical path is connected to construct a ring oscillator.

That is, the semiconductor integrated circuit of the present invention is characterized in that the ring oscillator is constructed by using the critical path. It is easy to measure the oscillation frequency of the critical path-ring oscillator from the outside as in the case of the measurement of a normal ring oscillator, and it is easy to calculate the speed of the circuit concerned on the basis of the frequency measurement.

In addition, the circuit concerned is a critical path for determining the whole performance of LSI, and the performance thereof can be measured at high precision, whereby the performance of LSI can be examined at the LSI tester level. When the distance between a first flip-flop circuit and a second flip-flop circuit is long, a relay buffer is inserted into between the output of the second flip-flop circuit and the input of the first flip-flop circuit at the minimum and requisite number. However, the performance delay caused by the insertion of the circuit concerned to the critical path is required to be set to such a range that it is remarkably small and negligible.

A high-performance/high price LSI test is not required for the measurement, and it would be sufficient if only a frequency counter is provided. The wafer test can be measured at the LSI tester level, so that a speed defective is prevented from being packaged and a screening test on a device is not required. Further, the cost can be reduced. Accordingly, there can be provided means for performing the LSI speed screening at the LSI tester level.

DETAILED DESCRIPTION OF THE PREFERRED EMBODIMENTS

Preferred embodiments according to the present invention will be described hereunder with reference to the accompanying drawings.

Figure 1:
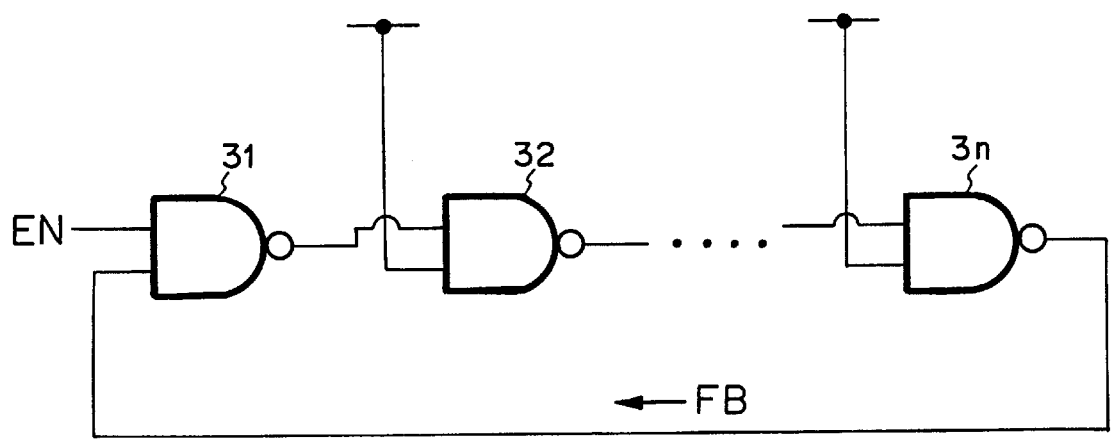
FIG. 1 is a circuit diagram showing the construction of a ring oscillator.
Figure 2:
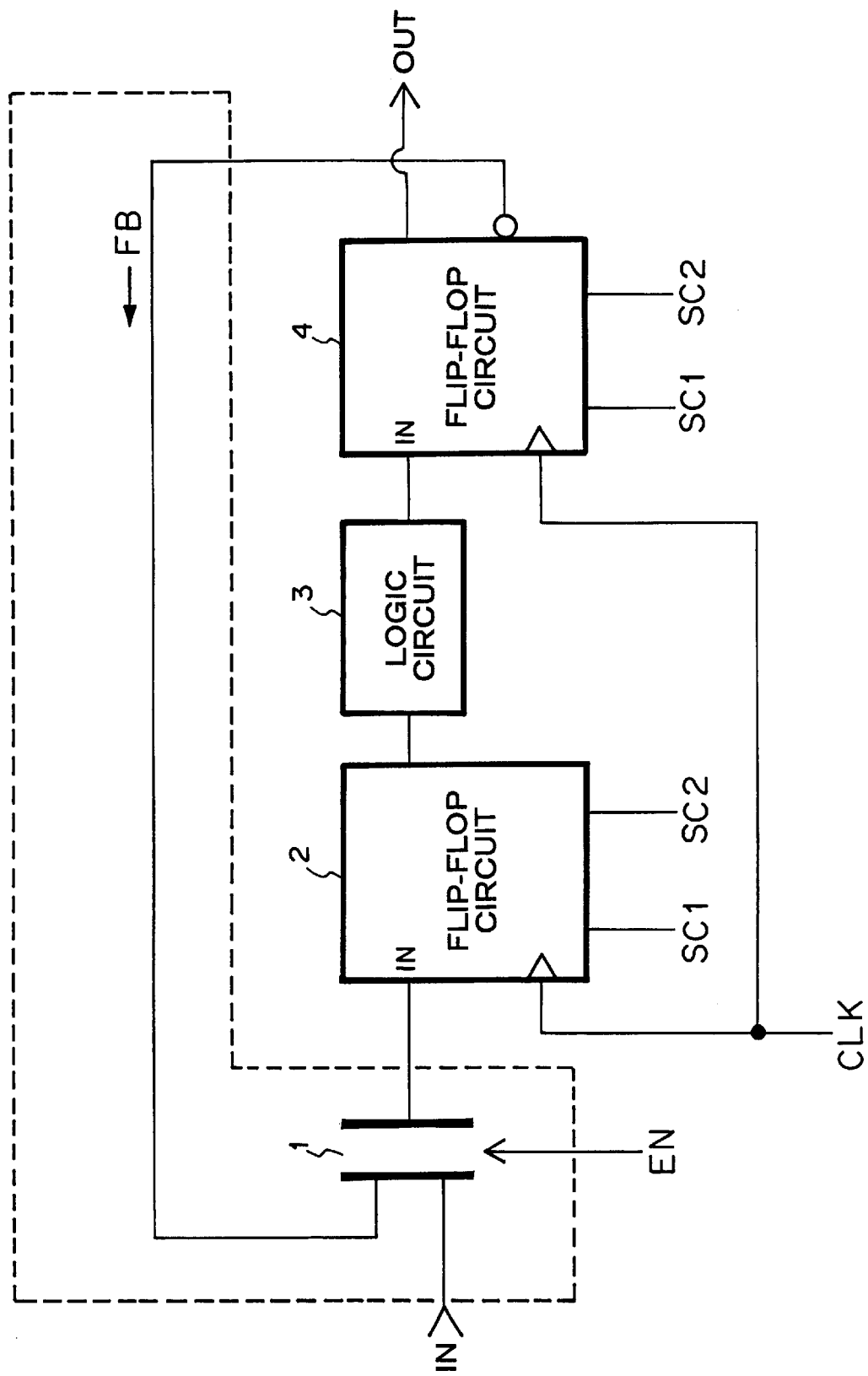
FIG. 2 is a circuit diagram showing the construction of a semiconductor integrated circuit according to an embodiment of the present invention.

FIG. 2 is a circuit diagram showing the construction of a semiconductor integrated circuit according to a first embodiment of the present invention.

In FIG. 2, the semiconductor integrated circuit comprises logic circuit 3 constituting a critical path in LSI, front and rear flip-flop circuits 2 and 4 between which the logic circuit 3 is sandwiched, and selector 1 which is connected to the flip-flop circuits 2. The input of the flip-flop circuit 2 is connected to the selector 1 through the a signal line for negative feedback. Consequently, the output signal of the flip-flop circuit 4 can be negatively fed back to input of the flip-flop circuit 2 by selecting of the selector 1. The output signal is signal FB as shown FIG. 2. The selector 1 selects an input signal (IN) or the signal FB by signal EN. Each of the flip-flop circuits 2 and 4 comprises such a type of flip-flop having two-layer scan clocks SC1 and SC2, and a common clock CLK is applied to each flip-flop.

The operation of the semiconductor integrated circuit will be described with reference to FIG. 2. Here, normal logic circuits such as the flip-flop circuits 2 and 4, and the logic circuit 3 are arranged in the portion outside a dotted line area of FIG. 2, and the normal logic circuits constitute a signal path called as critical path which determines the performance of LSI. The dotted line area represents a circuit added in the embodiment of the present invention, and the circuit is constructed so as to be inserted in the critical path.

The first embodiment of the present invention targets speed screening. The operation under the test concerned will be described.

First, a proper level is give to the signal EN so that the input of the selector 1 selects the signal FB.

Two-phase scan clocks SC1 and SC2 of the flip-flop circuits 2 and 4 are set so that the flip-flop circuits 2 and 4 are set to the through state. For example, LSSD (level sensitive scan design) or the like is known as setting of the flip-flop circuits 2 and 4 which operate with the two-phase scan clocks SC1 and SC2.

By setting the flip-flop circuits 2 and 4 to the through state, signals can be passed from the flip-flop circuit 2 to the flip-flop circuit 4 under the through state. Further, by negatively feeding back from the output of the flip-flop circuit 4 to the input of the flip-flop circuit 2, a ring oscillator construction can be built in the critical path (hereinafter referred to as critical path-ring oscillator).

In this case, the logic in the ring is required to be an inverted logic (it is indicated by putting a mark of "○" on the output portion of the flip-flop circuit 4 in FIG. 2). The critical path-ring oscillator is self-oscillated.

In a test other than the speed screening test or at a normal operating time, a proper level is given to the signal EN to switch the selector 1 so that the input side (IN side in FIG. 2) is selected, thereby cutting a negative feedback path through which the output of the flip-flop circuit 4 is negatively fed back to the input of the flip-flop circuit 2.

The measurement of the oscillation frequency of the critical path-ring oscillator from the outside can be easily carried out similar to the case of the measurement of a normal ring oscillator, so that the speed of the circuit concerned can be easily calculated from the measurement of the frequency. In addition, the circuit concerned is the critical path which determines the performance of the whole LSI, and the performance thereof can be measured with high precision.

Accordingly the performance of LSI can be examined at the LSI tester level. When the distance between the flip-flop circuit 2 and the flip-flop circuit 4 is long, a relay buffer is inserted into between the output of the flip-flop circuit 4 and the input of the flip-flop circuit 2 at the minimum and requisite number, and the performance delay caused by the insertion of the relay buffer to the critical path is required to be reduced to a remarkable small and negligible range.

Accordingly, a high-performance/high-price LSI tester is not required for the measurement, and it would be sufficient if only a frequency counter is provided. Further, since the wafer test can be also measured at the LSI tester level, it is unnecessary to fabricate a speed defective into a package and no screening on the device is required, so that the cost can be further reduced.

Figure 3:
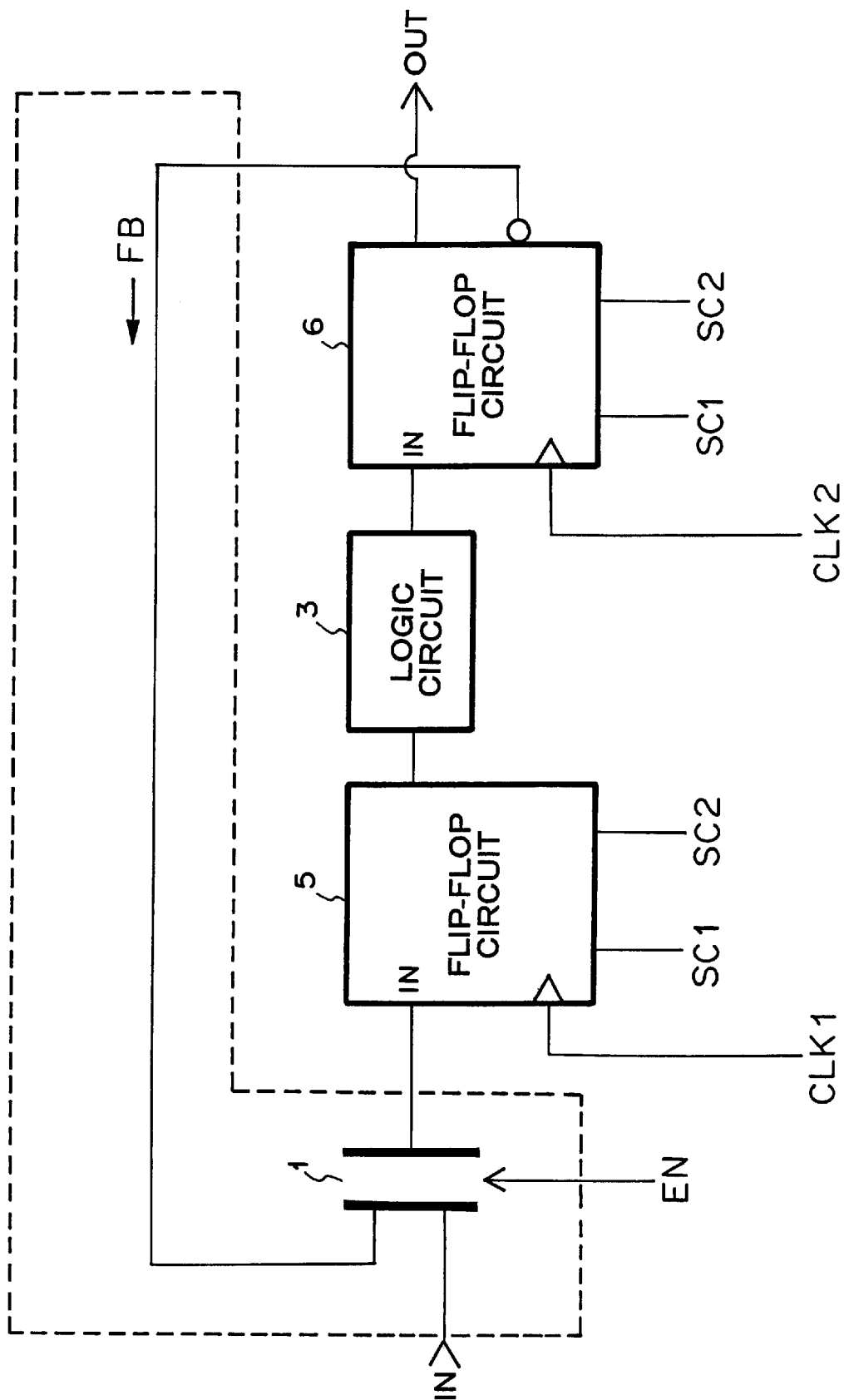
FIG. 3 is a circuit diagram showing the construction of a semiconductor integrated circuit according to another embodiment of the present invention.

FIG. 3 is a circuit diagram showing the construction of a semiconductor integrated circuit according to a second embodiment of the present invention.

In FIG. 3, the semiconductor integrated circuit according to the second embodiment of the present invention has substantially the same construction as the first embodiment of the present invention, but they differ in that a clock CLK1 for inputting to flip-flop circuit 5 and a clock CLK2 for inputting to flip-flop circuit 6 are different phase clocks in the semiconductor integrated circuit according to the second embodiment. The measurement of the frequency can be performed by the same circuit as the semiconductor integrated circuit of the first embodiment of the present invention even when these clocks are different phase clocks.

Figure 4:
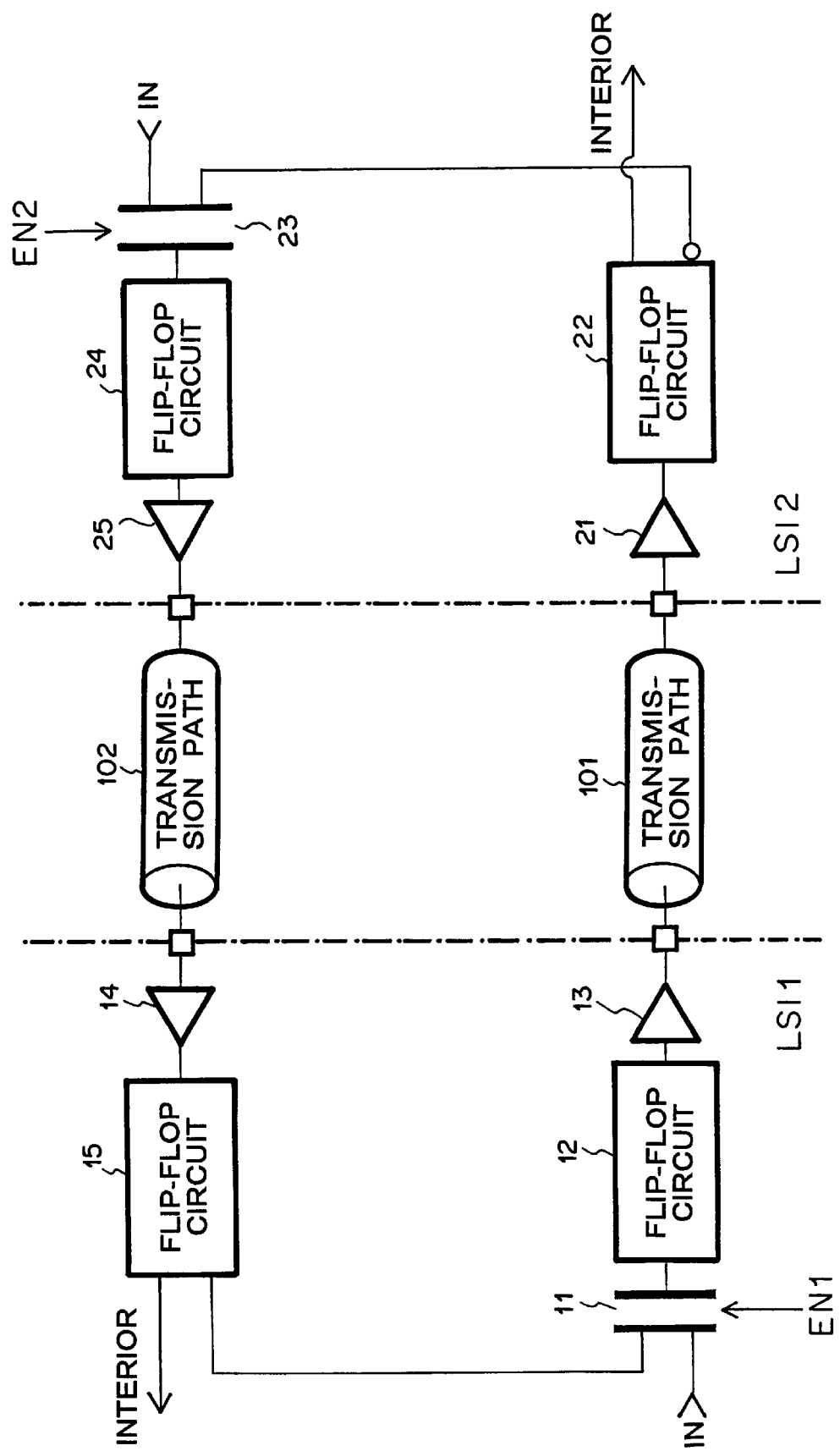
FIG. 4 is a circuit diagram showing the construction of a semiconductor device according to another embodiment of the present invention.

FIG. 4 is a circuit diagram showing the construction of a semiconductor device according to a third embodiment of the present invention.

In FIG. 4, the semiconductor device of the third embodiment of the present invention is achieved by expanding the first (second) embodiment between LSIs.

That is, the third embodiment of the present invention is applied to the construction in which LSI 1 comprising selector 11, flip-flop circuits 12 and 15, output buffer 13 and input buffer 14 and LSI 2 comprising selector 23, flip-flop circuits 22 and 24, output buffer 25 and input buffer 21 are connected to each other through inter-LSI transmission paths 101 and 102. The output signal of the flip-flop circuit 15 is outputted to the interior of the LSI 1 and the output signal of the flip-flop circuit 22 is outputted to the interior of the LSI 2.

Flip-flop circuit 12 and output buffer 13 of the LSI 1, the inter-LSI transmission path 101, and input buffer 21 and flip-flop circuit 22 of the LSI 2 construct a first critical path. Flip-flop circuit 24 and output buffer 25 of the LSI 2, the inter-LSI transmission path 102, and input buffer 14 and flip-flop circuit 15 of the LSI 1 construct a second critical path. The first and second critical path is connected to construct a ring oscillator. The ring oscillator is constructed by selecting of the selectors 11 and 23.

The selector 11 selects one of an output signal of the second critical path and an input signal to the first critical path and inputs the signal selected to the first critical path, and the selector 23 selects one of an output signal of the first critical path and an input signal to the second critical path and inputting the signal selected to the second critical path.

In this case, a measurement target is not a critical path, but an inter-LSI line (transmission paths 101 and 102 between LSIs). Further, an input/output buffer is required to be also prepared for a returning path. Therefore, if the going path and the returning path are designed to have the same circuit construction as shown in FIG. 4, the transmission delay at one side can be easily calculated as a half of the going/returning amount.

The difference from the foregoing description (the description on the first (second) embodiment) resides in that in the case of the delay measurement of the inter-LSI transmission, it is impossible to carry out the measurement by the LSI tester and the measurement is carried out under the state that the print board is mounted. However, not only the delay in the LSIs 1 and 2, but also the delay between LSIs can be measured by the same circuit construction as described above.

As described above, according to the present invention, in the semiconductor integrated circuit containing the critical path representing the signal path, there could be achieved such an effect that the performance of LSI can be examined at the LSI tester level if the ring oscillator is constructed by the critical path.

What is claimed is:

1. A semiconductor integrated circuit containing a critical path representing a signal path, comprising a ring oscillator which is constructed so as to negatively feed back the output of said critical path to the input of said critical path, wherein said critical path comprises a logic circuit, and first and second flip-flop circuits arranged at the input and output sides of said logic circuit, respectively, a common clock signal being applied to each of said first and second flip-flop circuits.

2. The semiconductor integrated circuit as claimed in claim 1, wherein said signal line is constructed so as to negatively feed back the output of said second flip-flop circuit to the input of said first flip-flop circuit.

3. A semiconductor integrated circuit containing a critical path representing a signal path, comprising a ring oscillator which is constructed so as to negatively feed back the output of said critical path to the input of said critical path, and further comprising a signal line for negatively feeding back the output of said critical path, and a selector for selecting either one of a signal of said signal line and an input signal to said critical path and inputting the signal selected to said critical path, wherein said critical path comprises a logic circuit, and first and second flip-flop circuits arranged at the input and output sides of said logic circuit, respectively, a common clock signal being applied to each of said first and second flip-flop circuits.

4. The semiconductor integrated circuit as claimed in claim 3, wherein said signal line is constructed so as to negatively feed back the output of said second flip-flop circuit to the input of said first flip-flop circuit.

5. A semiconductor integrated circuit containing a critical path representing a signal path, comprising a ring oscillator which is constructed so as to negatively feed back the output of said critical path to the input of said critical path, wherein said critical path comprises a logic circuit, and first and second flip-flop circuits arranged at the input and output sides of said logic circuit respectively, independent clock signals being applied to said first and second flip-flop circuits, respectively.

6. The semiconductor integrated circuit as claimed in claim 5, wherein said signal line is constructed so as to negatively feed back the output of said second flip-flop circuit to the input of said first flip-flop circuit.

7. A semiconductor integrated circuit containing a critical path representing a signal path, comprising a ring oscillator which is constructed so as to negatively feed back the output of said critical path to the input of said critical path, and further comprising a signal line for negatively feeding back the output of said critical path, and a selector for selecting either one of a signal of said signal line and an input signal to said critical path and inputting the signal selected to said critical path, wherein said critical path comprises a logic circuit, and first and second flip-flop circuits arranged at the input and output sides of said logic circuit respectively, independent clock signals being applied to said first and second flip-flop circuits, respectively.

8. The semiconductor integrated circuit as claimed in claim 7, wherein said signal line is constructed so as to negatively feed back the output of said second flip-flop circuit to the input of said first flip-flop circuit.

9. A semiconductor device comprising:
   first and second semiconductor integrated circuits; and
   first and second transmission paths connecting to each other between said first semiconductor and said second semiconductor,
   wherein at least one circuit element of said first semiconductor integrated circuit, said first transmission path and at least one circuit element of said second semiconductor integrated circuit construct a first critical path, at least one circuit element of said first semiconductor integrated circuit, said second transmission path and at least one circuit element of said second semiconductor integrated circuit construct a second critical path, and said first and second critical path is connected to construct a ring oscillator.

10. The semiconductor device as claimed in claim 9, wherein said first semiconductor integrated circuit contains a selector for selecting either one of an output signal of said second critical path and an input signal to said first critical path and inputting the signal selected to said first critical path, and said second semiconductor integrated circuit contains a selector for selecting either one of an output signal of said first critical path and an input signal to said second critical path and inputting the signal selected to said second critical path.

* * * * *